United States Patent [19]
Park et al.

[11] Patent Number: 5,528,628
[45] Date of Patent: Jun. 18, 1996

[54] APPARATUS FOR VARIABLE-LENGTH CODING AND VARIABLE-LENGTH-DECODING USING A PLURALITY OF HUFFMAN CODING TABLES

[75] Inventors: Ju-ha Park, Suwon; Byeung-woo Jeon, Sungnam; Jechang Jeong, Seoul, all of Rep. of Korea

[73] Assignee: Samsung Electronics Co., Ltd., Kyungki-Do, Rep. of Korea

[21] Appl. No.: 381,494

[22] Filed: Jan. 31, 1995

[30] Foreign Application Priority Data

Nov. 26, 1994 [KR] Rep. of Korea .............. 94-31360

[51] Int. Cl.$^6$ .............. H04B 1/66; H04B 14/04; H04N 11/02
[52] U.S. Cl. .............. 375/240; 375/253; 348/390
[58] Field of Search .............. 375/240, 253; 348/390, 420; 358/427, 430; 370/118

[56] References Cited

U.S. PATENT DOCUMENTS

| | | | |
|---|---|---|---|
| 4,546,342 | 10/1985 | Weaver et al. | 375/240 |
| 4,730,348 | 3/1988 | MacCrisken | 375/240 |
| 5,226,640 | 7/1993 | Puzey | 271/107 |
| 5,319,457 | 6/1994 | Nakahashi et al. | 348/387 |
| 5,402,244 | 3/1995 | Kim | 358/430 |
| 5,408,501 | 4/1995 | Cornaby | 375/260 |
| 5,416,604 | 5/1995 | Park | 358/433 |

*Primary Examiner*—Stephen Chin
*Assistant Examiner*—Jeffrey W. Gluck
*Attorney, Agent, or Firm*—Sughrue, Mion, Zinn, Macpeak & Seas

[57] ABSTRACT

An apparatus for variable-length-coding input symbols using a plurality of variable-length-code tables includes N variable-length-code tables each having a symbol-codeword association different from the others according to statistics regarding the symbols and a variable-length-coding device for coding the input symbols according to each of the variable-length-code tables for every block in a predetermined block data unit, for generating codewords, and for providing both table information representing each of the variable-length-code tables utilized in generating the respective codewords and a control signal indicating that variable-length-coding to a predetermined block data unit has been completed. The apparatus also includes buffers which store the codewords generated by the variable-length-coding device, an optimum table determining device receiving the output codewords for controlling the buffer so as to output codewords with a minimum amount of data for the block data unit, for supplying the table information from the variable-length-coding device and for providing table selection information representing a variable-length-code table producing the minimum amount of data for an input block data unit. The apparatus further includes a first switching circuit which receives table selection information and codewords and respectively outputs data in response to the output control signal. The apparatus advantageously can improve data compression efficiency. A complementary decoder, which can be used in building a communication system, is also described.

13 Claims, 2 Drawing Sheets

APPARATUS FOR VARIABLE-LENGTH CODING AND VARIABLE-LENGTH-DECODING USING A PLURALITY OF HUFFMAN CODING TABLES

BACKGROUND OF THE INVENTION

1. Field of the Invention

The present invention relates to an apparatus for coding and decoding digital image data and, more particularly, to an apparatus for variable-length-coding digital data and variable-length-decoding the variable-length-coded data using a plurality of Huffman code tables.

The instant application is based on Korean Patent Application No. 94-31360, which is incorporated herein by reference for all purposes.

2. Description of Related Art

Generally, systems for compressing and reconstructing image data reduce the amount of data to be transmitted by using methods such as Discrete Cosine Transform (DCT) quantization and Differential Pulse Code Modulation (DPCM), i.e., Lossy Encoding methods. A large amount of data is compressed by means by variable-length-coding, i.e., Lossless Encoding.

In the variable-length-coding, "run"·"level" is proposed by zigzag-scanning quantized transformation coefficients, and symbols made of "run"·"level" are replaced with codewords derived using a Huffman code. Usually, the term "run" denotes the number of coefficients which continuously have values of "0", and the "level" is a value of a coefficient following coefficient(s) having a value of "0". In case of representing one symbol by the run and level, a high value of the run and level indicates a low statistical probability of the symbol's occurrence. Huffman coding in variable-length-coding allocates codes of differing lengths according to the probability of occurrence of a predetermined symbol. That is, the key idea of Huffman coding is to use a shorter codeword for a symbol with more frequent occurrences. A Huffman coding device is designed to estimate the probability of symbol occurrence for each symbol and to act as follows: the higher probabilities are assigned the shorter codewords while the lower probabilities of symbol occurrence are assigned the longer codewords.

FIG. 1 is a block diagram showing a conventional variable-length-coding apparatus using a Huffman code. The variable-length-coding apparatus is designed to use one predetermined Huffman code table 13. The Huffman code table 13 is composed of different length codes according to the probabilities of occurrence of the predetermined symbols in the input data. That is, the higher the probability of run-level data is, the shorter the codeword length. In actual practice, the statistics of the input data can vary, which can result in inefficient coding of the input symbols. In other words, inefficient coding results when a symbol having a relatively high probability of occurrence is coded with a relatively long codeword, and a symbol having a relatively low probability of occurrence is coded with a relatively short codeword. In order to eliminate this problem associated with a change in the statistics of the input data, the Huffman code table must be rearranged, and the rearranged table transmitted to the decoder. Thus, inefficient coding results in reduced data compression efficiency, and rearranging and retransmitting the rearranged table results in increased overhead.

Furthermore, a variable-length-coding method using, selectively, two Huffman code tables has been proposed by the Motion Picture Experts Group (MPEG), but this technique causes a reduction in the compression efficiency according to the characteristics of the video signal, since each of the Huffman code tables is selected irrespective of the occurrence of the variable-length-coded (VLC) data. Variable-length image coding systems which respectively perform variable-length-coding of signals input through multi-channels are disclosed in U.S. Pat. No. 5,319,457 to Nakahashi et al. The variable-length image coding system codes multi-channel parallel data and then multiplexes the coded data so as to transmit it at a specified speed. The coders are selected based on the number of bits obtained by different variable-length coders for every channel to thereby transmit the VLC data at the specified speed.

SUMMARY OF THE INVENTION

The present invention was motivated by a desire to overcome the problems associated with the prior art devices and methods described above.

An object of the present invention is to provide a variable-length-coding apparatus which generates variable-length-coded (VLC) data into a minimum amount of data using a plurality of variable-length-code tables and subsequently transmits variable-length-code table selection information for the respective VLC data, thereby improving data compression efficiency.

Another object of the present invention is to provide a variable-length-coding apparatus which performs variable-length-coding through one variable-length coder using a plurality of variable-length-code tables to thereby improve data compression efficiency.

These and other objects, features and advantages according to the present invention are accomplished by an apparatus for variable-length-coding input symbols using a plurality of variable-length-code tables. Advantageously, the apparatus includes N variable-length-code tables having symbol-codeword association different from each other according to respective statistics of the symbols, N variable-length coders, which are individually connected to each of the variable-length-code tables, for variable-length-coding the input symbols in a predetermined block data unit using a corresponding variable-length-code table and for generating codewords, and N buffers, which are individually connected to output terminals of each of the variable-length coders, for storing codewords generated by the connected variable-length coder. The apparatus preferably includes an optimum table determining device acting as an optimum table determining means for producing table information representing a respective Huffman code table having a minimum amount of data for the block data unit on the basis of a data amount representing the codewords generated by each of the variable-length coders and a device acting as means for producing codewords stored in a respective one of the buffers, in response to the table information generated by the optimum table determining means.

These and other objects, features and advantages according to the present invention are provided by an apparatus for variable-length-coding input symbols using a plurality of variable-length-code tables, wherein the apparatus includes N variable-length-code tables each having a symbol-codeword association different from all others according to statistics of the symbols, a variable-length-coding device acting as means for variable-length-coding the input symbols according to each of the variable-length-code tables for every block in a predetermined block data unit, generating codewords, for producing both table information representing each of the variable-length-code tables utilized in generating codewords and a control signal indicating that variable-length-coding for the block data unit is completed, and buffers for storing codewords generated by the variable-length-coding means. In an exemplary case, the apparatus includes an optimum table determining device acting as means for receiving output codewords from the variable-length-coding means and for controlling the buffer so as to output codewords having the minimum amount of data for the block data unit, the apparatus being supplied with the table information from the variable-length-coding means for producing table selection information representing a respective variable-length-code table having a minimum amount of data for the block data unit, and a first switching circuit for receiving table selection information from the optimum table determining means and codewords output from the buffer, and respectively providing output data in response to the output control signal.

Still another object of the present invention is to provide a variable-length-decoding apparatus which variable-length-decodes codewords supplied from the variable-length coder, using variable-length-code tables corresponding to the variable-length-code tables and variable-length-code table information utilized in variable-length-coding in the variable-length-coding apparatus.

These and other objects, features and advantages according to the present invention are provided by an apparatus for variable-length-decoding input codewords using a plurality of variable-length-code tables. Advantageously, the apparatus can include a variable-length-decoding device acting as means for decoding codewords generated by the variable-length-coding apparatus and generating symbols, N variable-length-code tables, corresponding to variable-length-code tables used in the variable-length-coding, respectively, and having a symbol-codeword association different from each other according to the statistics of the symbols, and a device acting as a means, receiving the table information from an optimum table determining means, for selecting a respective variable-length-code table to be used in variable-length-decoding, and for supplying the selected variable-length-code table to the variable-length-decoding means.

BRIEF DESCRIPTION OF THE DRAWINGS

The preferred embodiments are described with reference to the drawings wherein.

DETAILED DESCRIPTION OF THE PREFERRED EMBODIMENT

Figures 1, 2:
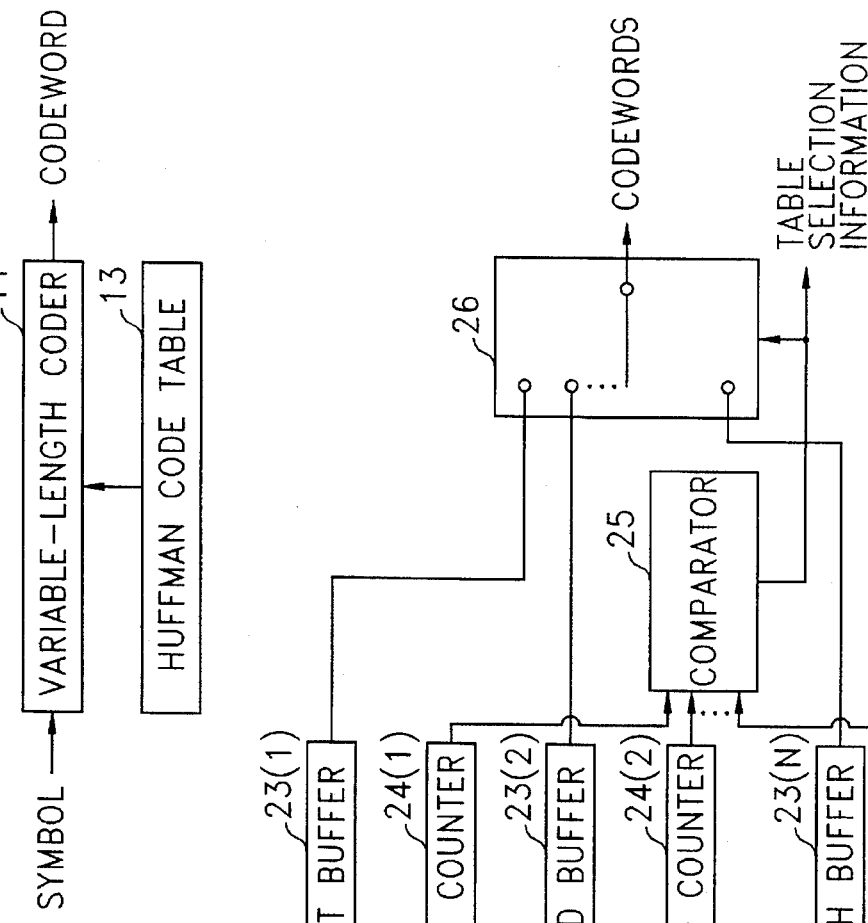
FIG. 1 is a block diagram showing a conventional variable-length-coding apparatus using a Huffman code table.
FIG. 2 is a block diagram illustrating a variable-length-coding apparatus using a plurality of diverse Huffman code tables in accordance with one preferred embodiment of the present invention.

FIG. 2 is a block diagram illustrating a variable-length-coding apparatus using a plurality of diverse Huffman code tables in accordance with one preferred embodiment of the present invention. Symbols are input to N variable-length coders 21(1), 21(2), . . . , 21(N) in slice units, respectively. Preferably, these symbols are in the form of run-level when variable-length-coding prior to run-length-coding (RLC) is being performed. The variable-length coders 21(1), 21(2), . . , 21(N) individually include corresponding Huffman code tables 22(1), 22(2), . . . , 22(N). The Huffman code tables 22(1), 22(2), . . . , 22(N) have symbol-codeword association different from each other according to different assigned statistical probabilities for the symbols.

A first variable-length coder 21(1) receives symbols and variable-length-codes the symbols using a first Huffman code table 22(1). The first variable-length coder 21(1) transmits codewords generated by variable-length-coding to a first buffer 23(1), in which the transmitted data is stored. Preferably, the first variable-length coder 21(1) transmits the codewords generated by variable-length-coding to a first counter 24(1), which receives the transmitted data and calculates the respective code length of the input codes. A second variable-length coder 21(2), at the same time, receives the symbols and variable-length-codes them using a second Huffman code table 22(2).

Advantageously, the second variable-length coder 21(2) transmits codewords generated by variable-length-coding to the second buffer 23(2), in which the transmitted data is stored, and to the second counter 24(2), by which the respective code length of the input codes is calculated and a counted value is supplied to a comparator 25. The above signal processing is also equally applied to all other variable-length coders illustrated in FIG. 2. It will be appreciated that variable-length-coding is performed in a predetermined block data unit; one frame or one slice can be used as the block data unit.

Since N variable-length coders simultaneously receive the input symbols and variable-length code the symbols using Huffman code tables different from each other, counters 24(1), 24(2), . . . 24(N) output diverse count values. The count values output by the counters are counted for a predetermined unit, i.e, a frame unit or a slice unit. The comparator 25 receives and compares the respective count values from each counter, and provides to a switching unit 26, a control signal for selecting the respective buffer with the minimum data value. Comparator 25 advantageously outputs table selection information indicating which of the respective Huffman code tables is selected for each predetermined block data unit. It will be noted that the table selection information can be used in a variable-length-decoding apparatus like that shown in FIG. 3 and described in greater detail below. The switching unit 26 chooses any one of the respective output terminals of N buffers 23(1), 23(2) . . . , 23(N)in response to a selecting signal generated by the comparator 25 and outputs a signal supplied from a corresponding buffer as the variable-length-coded data.

Figure 3:
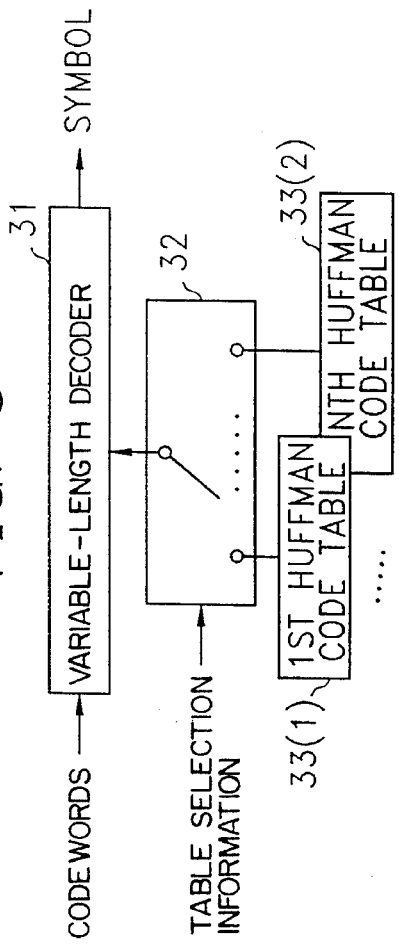
FIG. 3 is a block diagram showing an apparatus for decoding the data coded by the apparatus of FIG. 2.

FIG. 3 shows an apparatus for decoding the data coded by an apparatus like that shown in FIG. 2, wherein the variable-length-decoding apparatus includes one variable-length decoder 31. The variable-length decoder 31 is composed of N Huffman code tables 33(1) . . . , 33(N) corresponding to each of N Huffman code tables 22(1), 22(2), . . . , 22(N) in the variable-length-coding apparatus of FIG. 2. The Huffman code tables 33(1), . . . , 33(N) advantageously have the same format as the Huffman code tables 22(1), 22(2) . . . , 22(N). A switching unit 32 is connected between variable-length decoder 31 and N Huffman code tables 33(1), 33(2), . . . , 33(N), which selects one of N Huffman code tables 33(1), 33(2), . . . , 33(N) according to the table selection information transmitted from the coding side and connects the selected table to the variable-length decoder 31. Thereafter, the decoder 31 generates symbols using the Huffman table selected by the table selection information that is determined for every block in the pre-defined block data unit.

Figure 4:
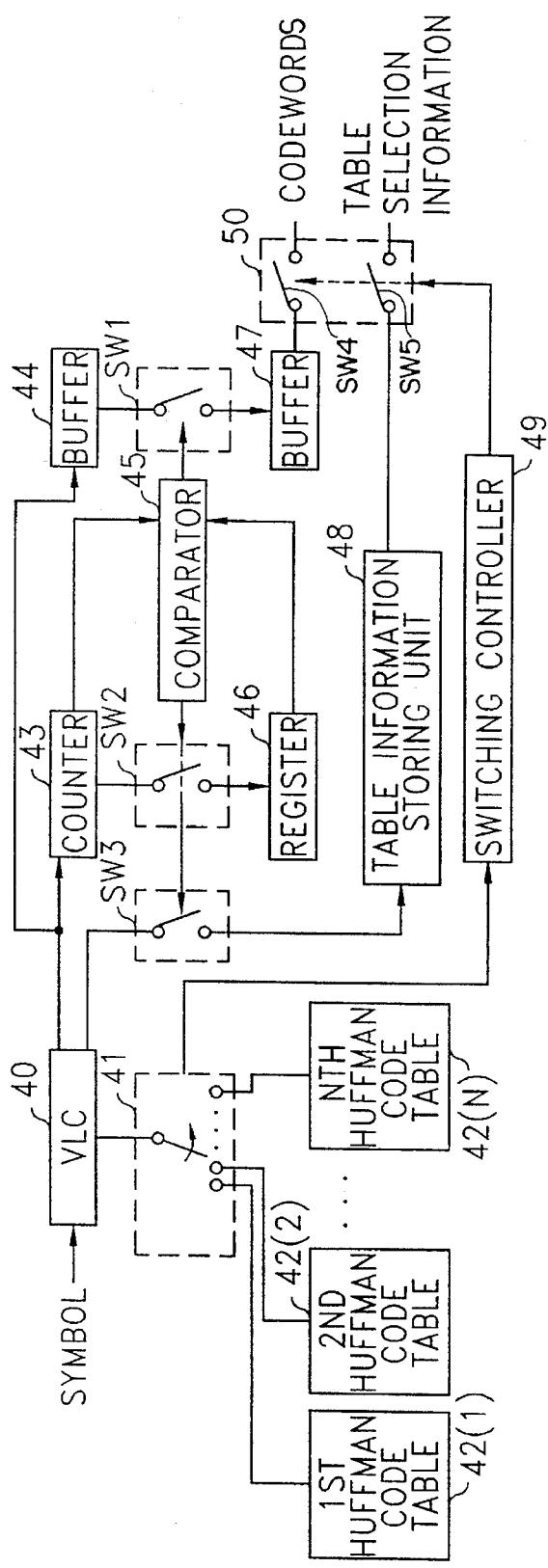
FIG. 4 is a block diagram showing a variable-length-coding apparatus in accordance with another preferred embodiment of the present invention.

FIG. 4 shows a variable-length-coding apparatus in accordance with another preferred embodiment of the present invention. In FIG. 4, Huffman code tables 42(1), . . . , 42(N) have symbol-codeword associations different from each other according to the statistical probabilities of the symbols. A variable-length coder 40 receives the symbols and outputs codewords and table information. A first buffer 44 stores the output of the variable-length coder 40, and a second buffer 47 stores the output of the first buffer 44. Each buffer 44 or 47 has a data storage capacity for storing codewords generated using one variable-length-code table. A first switch SW1 switches an output supplied from buffer 44 to buffer 47. A counter 43 calculates the number of bits of the encoded symbols supplied from the variable-length coder 40. A register 46 stores the output of the counter 43, and a second switch SW2 switches a signal supplied from counter 43 to register 46. The register 46 stores the maximum value generated in the counter 43 as an initial value. A table information storing unit 48 stores the table information provided from the variable-length coder 40. A third switch SW3 switches a signal supplied from variable-length coder 40 to table information storing unit 48.

During operation, the comparator 45 compares the output of the counter 43 with that of register 46 and generates a second control signal. Switches SW1, SW2 and SW3 are controlled by the second control signal supplied from the comparator 45. Outputs of the buffer 47 and table information storing unit 48 are supplied to a first switching circuit 50, which includes a fourth switch SW4 for switching the output of the buffer 47 and a fifth switch SW5 for switching the output of the table information storing unit 48. Advantageously, a second switching circuit 41 selectively connects each of the Huffman code tables 42(1), . . . , 42(N) to the variable-length coder 40 and also provides a table switching signal to a switching controller 49, which generates a first control signal when the coding process for a predetermined block data is completed for all of the Huffman code tables 42(1), . . . , 42(N). The operation of FIG. 4 having the construction described above will be discussed in detail immediately below.

When symbols are supplied to the variable-length coder 40, it stores the input symbols in a predetermined block data unit. The second switching circuit 41 selects one of Huffman code tables and connects the selected table to the variable-length coder 40. Preferably, second switching circuit 41 outputs a table switching signal for the respective selected Huffman code table to the switching controller 49. The variable-length coder 40 performs variable-length-coding using the selected Huffman code table, and generates codewords and table information representing tables used in variable-length-coding. The codewords which are generated by the Huffman code table are supplied to the counter 43 and buffer 44, while the table information is provided to the third switch SW3. The counter 43 counts the number of bits of the codewords, which are generated according to each of the different Huffman code tables with respect to the data block unit of the symbols, and outputs the counted value to the comparator 45, which compares the counted value stored in the register 46 with that supplied from the counter 43 and generates a switch 'on' signal if the counted value from the counter 43 is less than that from the register 46. When switches SW1, SW2 and SW3 are all in an 'on' state, the table information is stored in the table information storing unit 48, the counted value of the counter 43 is preserved in the register 46, and the codewords stored in the buffer 44 are supplied to the buffer 47.

The variable-length coder 40 outputs the codewords using the next Huffman code table to the counter 43 and buffer 44, and then provides table information to the third switch SW3. Of course, the second switching circuit 41 also outputs a table switching signal to the switching controller 49. When the counted value from the counter 43 is input, the comparator 45 compares the counted value stored in the register 46 with that supplied from the counter 43 and generates a switch 'on' signal, as the result of comparison, if the counted value of the counter 43 is less than that of the register 46. If the counted value at counter 43 is greater than that stored in register 46, the comparator 45 outputs an 'off' signal.

In the case of generating an 'on' signal, the table information storing unit 48 stores new table information, the register 46 stores the newly counted value, and the buffer 47 stores the new codewords corresponding to the symbols produced in the variable-length coder 40. This process is performed for codewords generated by all Huffman code tables in the apparatus of FIG. 4. When variable-length-coding using all Huffman code tables has been completed, the table information storing unit 48 stores table information indicating the Huffman code table that produces codewords having the minimum amount of data produced. The buffer 47 stores the codewords generated thereby. The switching controller 49 generates a first control signal based on counting of the input table switching signals. The first control signal is output after codewords with a minimum amount of data as the result of comparison by the comparator 45 are stored in the buffer 47. The first switching circuit 50 outputs signals supplied from the buffer 47 and table information storing unit 48 when the first control signal is provided.

Output signals of the first switching circuit 50, i.e., codewords and table selection information for an optimum variable-length-coding, can be used by the apparatus of FIG. 3. Accordingly, the apparatus of FIG. 3 can decode using codewords and table selection information input from the apparatus of FIG. 4.

The variable-length-coding and variable-length-decoding systems using a plurality of Huffman code tables can perform an optimum variable-length-coding and variable-length-decoding according to the statistical variation of the symbols, without transmitting all information regarding allocations of symbols and codewords of the Huffman code tables actually used in an optimum variable-length-coding to the decoding side. Particularly, the apparatus that variable-length-codes using a plurality of Huffman code tables with one variable-length coder has the effect of reducing hardware in size below that required for constructing several variable-length coders.

While only certain embodiments of the invention have been specifically described herein, it will apparent that numerous modifications may be made thereto without departing from the spirit and scope of the invention.

What is claimed is:

1. An apparatus for variable-length-coding input symbols representing a data block using a plurality of variable-length-code tables, the apparatus comprising:

N variable-length-code tables each having a respective symbol-codeword association different from one another according to associated statistics of said symbols;

N variable-length coders, respectively connected to one of said N variable-length-code tables, for variable-lengthcoding said symbols having a predetermined block data unit using a corresponding one of said N variable-length-code tables, thereby generating a plurality of codewords;

N buffers, respectively connected to an output terminal of one of said N variable-length coders, for storing corresponding said codewords generated by said one of said N variable-length coders;

optimum table determining means for outputting table information representing the respective one of said N variable-length code tables producing a minimum amount of data for said block data unit on the basis of an amount of respective data of the codewords generated by each of said N variable-length coders; and means for outputting respective said codewords stored in a respective one of said buffers, in response to the table information generated by said optimum table determining means.

2. The variable-length-coding apparatus as claimed in claim 1, wherein said optimum table determining means comprises:

a plurality of counters, each of said counters connected to a respective output terminal of one of said N variable-length coders, for counting a number of bits of all respective codewords obtained by variable-length-coding said symbols of said data block, and for outputting a respective counted value, corresponding to one of said N variable-length coders; and a comparator for comparing the generated counted values output by said counters and for outputting table selection information corresponding to a minimum counted value.

3. The variable-length coding apparatus as claimed in claim 1, wherein said N variable-length code tables include Huffman codes.

4. An apparatus for variable-length-coding input symbols representing a data block using a plurality of variable-length-code tables, the apparatus comprising:

N variable-length-code tables each having a respective symbol-codeword association different from one another according to associated statistics of said symbols, wherein each of said N variable-length code tables includes Huffman codes;

variable-length-coding means for variable-length-coding said symbols according to respective ones of said N variable-length-code tables for every data block having a predetermined block data unit, for generating codewords, and for producing both table information representing each of said N variable-length-code tables utilized in generating respective codewords and a control signal indicating that variable-length-coding of said block data unit has been completed;

buffers for storing respective codewords generated by said variable-length-coding means;

optimum table determining means receiving respective codewords from said variable-length-coding means for controlling said buffers so as to output respective said codewords with a minimum amount of data representing said block data unit, and for supplying table information from said variable-length-coding means and outputting table selection information representing a selected one of said N variable-length-code tables with a minimum amount of data for said block data unit; and first switching means for receiving and outputting said table selection information from said optimum table determining means and respective codewords output from said buffers in response to said control signal.

5. The variable-length-coding apparatus as claimed in claim 4, wherein said variable-length-coding means generates a plurality of codeword sets with respect to the data block, using a respective plurality of variable-length-code tables.

6. The variable-length-coding apparatus as claimed in claim 4, wherein said variable-length-coding means comprises:

second switching means for selecting said N of variable-length-code tables seriatim and for outputting a table switching signal in accordance with the selected variable-length-code table;

a switching controller, receiving said table switching signal, for generating an output control signal when variable-length-coding is completed with respect to all of said N variable-length-code tables utilized in variable-length-coding said block data unit; and a variable-length coder storing said symbols in predetermined block data unit, for variable-length coding said symbols with the respective one of said N variable-length-code tables selected through said second switching means, and for generating respective said codewords.

7. The variable-length-coding apparatus as claimed in claim 4, wherein said buffers comprise:

a first buffer for storing respective first codewords output from said variable-length-coding means;

a second buffer for storing respective second codewords output from said first buffer; and a first switch for supplying said first codewords from said first buffer to said second buffer, thereby storing said second codewords.

8. The variable-length-coding apparatus as claimed in claim 7, wherein said first buffer has a data storage capacity for storing at most said first codewords and said second buffer has a data storage capacity for storing at most said second codewords, wherein each of said first and second codewords is generated by one of said N variable-length-code tables.

9. The variable-length-coding apparatus as claimed in claim 7, wherein said optimum table determining means comprises:

a counter for counting a number of bits of the respective codewords generated by each of said N variable-length-coding tables and for producing respective counted values;

a register for storing a previously counted one of said counted values output from said counter as a previous counted value;

a second switch, located between said counter and said register, for supplying a respective one of said counted values from said counter to said register;

a table information storing unit for storing table information output from said variable-length-coding means;

a third switch for supplying the table information from said variable-length-coding means to said table information storing unit; and a comparator, receiving the respective one of said counted values output from said counter and said previous counted value from said register, for comparing the respective two counted values, and for controlling operation of said first, said second and said third switches, wherein said register initially stores an initial count value generated by said counter, and wherein said comparator switches said first, said second and said third switches "on" when the respective one of said counted values produced by said counter is less than said previous counted value of said register.

10. The variable-length-coding apparatus as claimed in claim 9, wherein said first switching means comprises:

a fourth switch for receiving the respective codewords output from said second buffer; and a fifth switch for receiving table selection information output from said table information storing unit, and wherein said first switching means outputs data supplied from said second buffer and said table information storing unit in response to said output control signal.

11. A communication system comprising:

means for generating a plurality of output codewords and corresponding table selection information from a plurality of input symbols representing a data block, said generating means further comprising:

N variable-length-code tables each having a symbol-codeword association different from all other of said tables according to statistics of said symbols;

N variable-length coders, respectively connected to one of said N variable-length-code tables, for variable-length-coding said symbols in a predetermined block data unit using a corresponding one of said N variable-length-code tables and for generating the respective codewords;

N buffers, respectively connected to output terminals of each of said variable-length coders, for storing said respective codewords generated by respective ones of said N variable-length coders;

optimum table determining means for generating said table selection information representing one of said N variable-length code tables producing a minimum amount of data corresponding to said block data unit based on an amount of each data of the respective codewords generated by each associated one of said variable-length coders; and means for providing respective codewords stored in a selected one of said buffers as said output codewords in response to said table selection information generated by said optimum table determining means;

means serially connected to said generating means for transmitting said output codewords and said table selection information; and means serially connected to said transmitting means for decoding said output codewords responsive to said table selection information, said decoding means further comprising:

variable-length decoding means for decoding said output codewords using a selected one of M variable-length-code tables;

means for storing said M variable-length-decode tables corresponding to said N variable-length-code tables; and means receiving said table selection information for selecting and supplying said selected one of said M variable-length-decode tables to said variable-length-decoding means.

12. A communication system comprising:

means for generating a plurality of output codewords and corresponding table selection information from a plurality of input symbols representing a data block, said generating means further comprising:

N variable-length-code tables having symbol-codeword association different from each other according to statistics of the symbols;

variable-length-coding means for variable-length-coding said symbols according to all of said variable-length-code tables for every block in a predetermined block data unit, for generating codewords, and for producing both table information representing each of said variable-length-code tables utilized in generating respective said codewords and a control signal indicating that completion of variable-length-coding of said block data unit;

a plurality of buffers for storing selected codewords generated by said variable-length-coding means;

optimum table determining means for receiving said codewords from said variable-length-coding means and controlling said buffers so as to generate said output codewords having a minimum amount of data for said block data unit for supplying table information from said variable-length-coding means as table selection information representing a respective one of said variable-length-code tables producing said minimum amount of data for said block data unit; and switching means for receiving said table selection information from said optimum table determining means and respective output codewords from a serially connected one of said buffers;

means serially connected to said generating means for transmitting said output codewords and said table selection information; and means serially connected to said transmitting means for decoding said output codewords responsive to said table selection information, said decoding means further comprising:

variable-length decoding means for decoding said output codewords using a selected one of M variable-length-code tables;

means for storing said M variable-length-decode tables corresponding to said N variable-length-code tables; and means receiving said table selection information for selecting and supplying said selected one of said M variable-length-decode tables to said variable-length-decoding means.

13. A decoder, comprising:

receiving means for receiving codewords generated by a variable-length coder using one of N variable-length-code tables and table selection information corresponding to said one of said N variable-length-code tables, said codewords each having a minimum amount of data among a plurality of codewords generated based on said N variable-length code tables; and decoding means for decoding said codewords responsive to said table selection information, said decoding means further comprising:

variable-length decoding means for decoding said codewords using a selected one of M variable-length-decode tables;

means for storing said M variable-length-decode tables corresponding to said N variable-length-code tables; and means for selecting and supplying said selected one of said M variable-length-decode tables to said variable-length-decoding means, based on said table selection information.

* * * * *